(12) United States Patent
Chen et al.

(10) Patent No.: US 6,194,249 B1
(45) Date of Patent: Feb. 27, 2001

(54) METHOD OF ASSEMBLY STRESS PROTECTION

(75) Inventors: Ming Hsien Chen, Tai-Zhong; Mei-Yen Li; Li-Don Chen, both of Hsin-Chu; Chih-Ming Chen, Tao-Yuan, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/431,133

(22) Filed: Nov. 1, 1999

(51) Int. Cl.[7] .......................... H01L 21/44; H01L 21/48; H01L 21/50

(52) U.S. Cl. .......................... 438/115; 438/106; 438/107; 438/110; 438/118

(58) Field of Search .................................. 438/106, 107, 438/110, 115, 118

(56) References Cited

U.S. PATENT DOCUMENTS

| | | | |
|---|---|---|---|
| 4,902,646 | 2/1990 | Nakano | 437/203 |
| 5,441,915 | 8/1995 | Lee | 437/195 |
| 5,618,757 | 4/1997 | Bothra et al. | 438/699 |
| 5,763,057 | 6/1998 | Sawada et al. | 428/209 |
| 5,798,298 | 8/1998 | Yang et al. | 438/622 |
| 5,913,110 | * | 6/1999 | Herbst . |
| 6,043,551 | * | 3/2000 | Seshan . |

* cited by examiner

Primary Examiner—Kevin M. Picardàt
Assistant Examiner—D. M. Collins
(74) Attorney, Agent, or Firm—George O. Saile; Stephen B. Ackerman

(57) ABSTRACT

The invention offers a solution to several problems associated wit IC packages that use a top layer of molded plastic. This has been achieved by inter-posing a dummy layer of dielectric material between the upper surface of the integrated circuit wafer and the molded plastic layer. This dummy layer is patterned and etched so that its surface becomes an alternating series of valleys and ridges, care being taken to ensure that all wiring lines are protected by being within ridges. This structure serves both to protect the wiring lines during the application of the molded plastic and, because of the large surface area of contact between plastic and wafer, excellent adhesion of the molded plastic to the wafer is obtained.

16 Claims, 2 Drawing Sheets

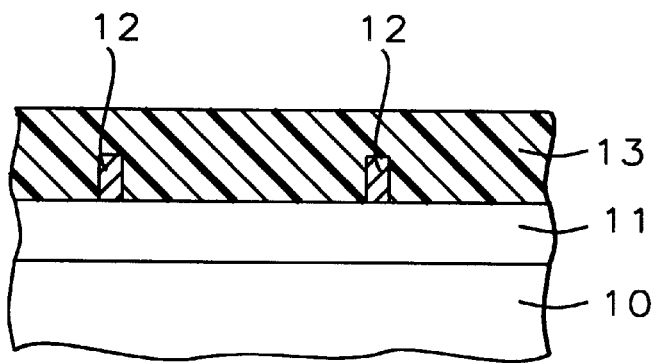
FIG. 1
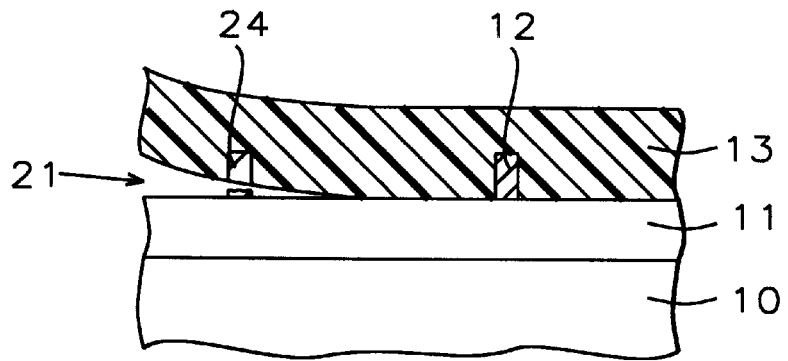
FIG. 2 - Prior Art
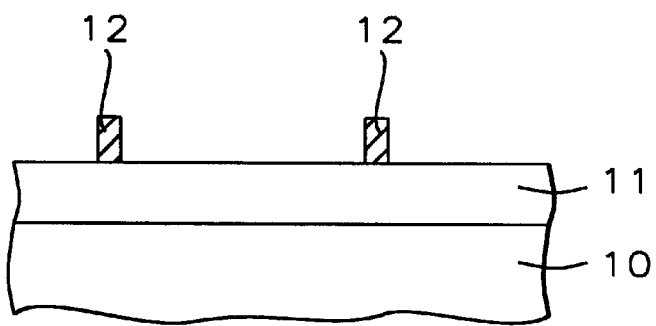
FIG. 3

METHOD OF ASSEMBLY STRESS PROTECTION

FIELD OF THE INVENTION

The invention relates to the general field of integrated circuit packaging with particular reference to protection by molded plastic.

BACKGROUND OF THE INVENTION

In general, integrated circuits consist of a silicon wafer on whose upper surface have been formed a number of layers, the topmost of these including several alternating layers of metal and dielectric. For low-cost packaging, it is common practice to encapsulate the structure with a layer of molded plastic. This layer of plastic is applied directly onto the topmost metal wiring, a final layer of passivation dielectric being omitted as a cost saving measure.

It has been found that there are certain problems associated with this approach. One such problem is the so-called single broken long metal line problem in which lines of wiring that are isolated on the surface (no other wiring lines close by) are subject to destruction as a result of the application of the molding plastic (usually in the form of a jet carrying significant force). Another, more general, problem is that during thermal cycling, because of thermal stress due to mismatch between the plastic and the silicon, the possibility of delamination can arise.

Referring now to FIG. 1, we show, in schematic cross-section, a portion of a silicon wafer 10 in whose upper surface various components making up integrated circuits have been formed. The inter-metal dielectric layer 11 is seen on the surface of wafer 10 with two examples of the wiring (seen in cross-section) on its top surface, shown schematically as projections 12. Covering the top surface of 11 as well as metallic wiring 12, is layer 13 of molded plastic.

In FIG. 2 we illustrate the two types of problem, discussed above, and their effect on the structures shown in FIG. 1. As a result of stress due to thermal mismatch, plastic layer 13 has delaminated, as pointed to buy Arrow 21, exposing the top surface of the structure to external contamination. Also seen is broken wire 24 which was damaged during the molding process and which (in this particular example) has been pulled away from the surface by the plastic.

One solution to the lone wire breakage problem that has been described in the prior art is the addition of extra dummy lines (unconnected to the main circuits) that help to reduce and distribute the force of the molding jet. While effective in the prevention of breakage, this solution makes a circuit susceptible to parasitic capacitor effects and is therefore undesirable from an electrical standpoint. Additionally, providing dummy lines, while reducing the probability of delamination during thermal cycling, will not always eliminate it, particularly if large uncovered areas on the surface of the final inter-metal dielectric layer still remain.

A routine search of the prior art was made but no solution to the above discussed problems similar to those of the present invention were encountered. Several references of interest were however found. For example, Bothra et al. (U.S. Pat. No. 5,618,757), as part of their process also formed dummy raised areas of oxide, but their process then goes on to fill the valleys with spin-on-glass as a way of planarizing, thereby teaching away from the present invention.

Nakano (U.S. Pat. No. 4,902,646) shows a method of forming dummy metal (as opposed to dielectric) patterns while Lee (U.S. Pat. No. 5,441,915) and Yang et al. (U.S. Pat. No. 5,798,298) both teach the dummy metal line process that we discussed above.

SUMMARY OF THE INVENTION

It has been an object of the present invention to provide a process and structure whereby low-cost packaging of an integrated circuit can be achieved.

Another object of the invention has been that the top layer of said packaged integrated circuit be of molded plastic.

A still further object of the invention has been that no damage be done to the upper-most wiring, particularly long single metal lines, during the molding process.

Yet another object of the invention has been that said molded plastic layer remain firmly adhering to the upper surface of the integrated circuit and not be subject to delamination as a result of thermal cycling.

These objects have been achieved by inter-posing a dummy layer of dielectric material between the upper surface of the integrated circuit wafer and the molded plastic layer. This dummy layer is patterned and etched so that its surface becomes an alternating series of valleys and ridges, care being taken to ensure that all wiring lines are protected by being inside ridges. This structure serves both to protect the wiring lines during the application of the molded plastic and, because of the large surface area of contact between plastic and integrated circuits, excellent adhesion of the molded plastic to the wafer is obtained.

BRIEF DESCRIPTION OF THE DRAWINGS

FIG. 1 is a schematic cross-section of a prior art package.

FIG. 2 illustrates problems that can arise during thermal cycling of the type of package shown in FIG. 1.

FIG. 3 shows the starting point for the process of the present invention.

DESCRIPTION OF THE PREFERRED EMBODIMENTS

Figure 4:
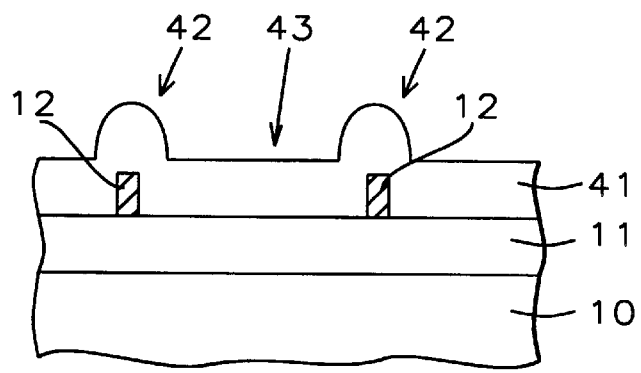
FIG. 4 illustrates a key feature of the present invention, namely the deposition of a dummy dielectric layer over the topmost wiring level.

The present invention will be described in terms of the process used to form the desired end structure. This will also serve to describe the structure itself.

We begin by referring to FIG. 3 which shows, in schematic cross-section, a portion of a silicon wafer 10 in whose upper surface various components making up integrated circuits have been formed. Also shown is the topmost inter-metal dielectric (IMD) layer 11 on whose top surface projections 12 are seen, representing top surface wiring. At this point, manufacture of the integrated circuit wafer is complete and all that remains is to package it for use in the field. As already discussed, a low cost method of achieving this is to form a layer of molded plastic (such as layer 13 in FIG. 1) over the surface of 11, including the wires 12.

In FIG. 4 we illustrate the next step in the process of the present invention, which is a departure from what would be prior art practice. This key step is the deposition of dummy dielectric layer 41 (which is preferably of silicon oxide, but other dielectric materials (such as nitrides or oxynitrides could be used) on the surface of layer 11. A conformal coating method such as CVD (chemical vapor deposition) is used when laying down layer 41 to ensure that the thickness of layer 41 (between about 1 and 2 microns) is approximately the same above the wiring (such as at 42) as it is above the non-metalized portions of the surface such as at 43.

Figure 5:
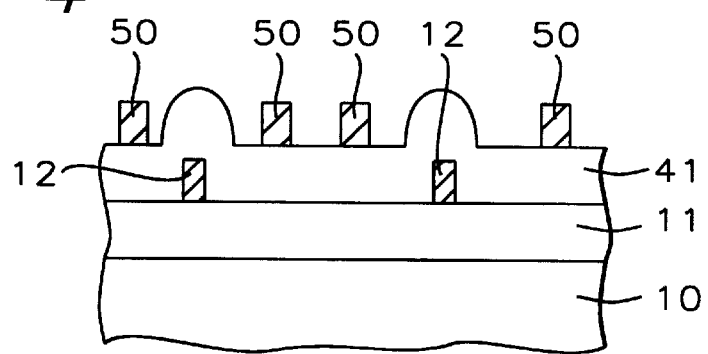
FIGS. 5 and 6 show how said dummy layer is processed to form a pattern of ridges and valleys.
Figure 6:
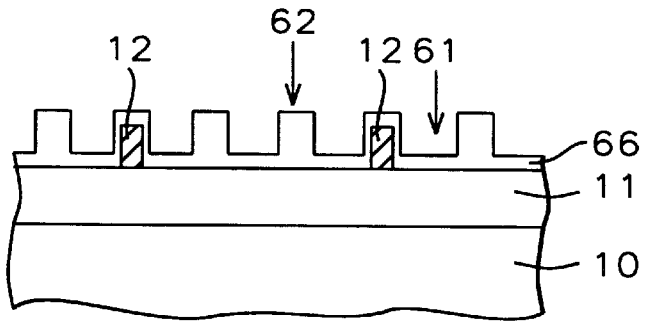

As shown in FIG. 5, photoresist mask 50 is then formed on the surface of dummy layer 41, following which layer 41 is etched for between about 5 and 10 minutes at a temperature between about 100 and 140° C., so that, as shown in FIG. 6, its thickness in the unmasked areas is reduced to between about 0.2 and 0.5 microns and its surface becomes a pattern of alternating ridges such as 62 and valleys such as 61.

Figure 7:
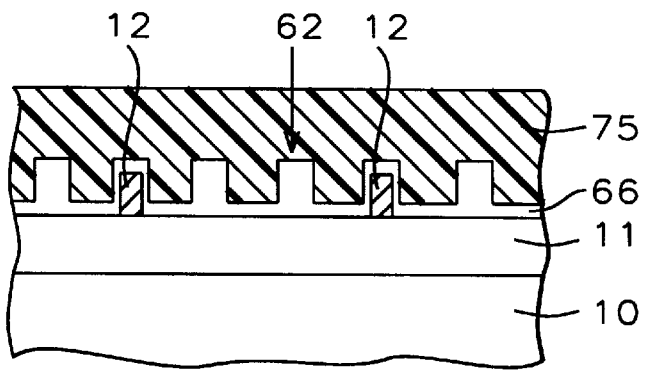
FIG. 7 shows the package resulting from the process of the present invention.

Packaging of the structure is completed by forming a layer of molded plastic 75 on patterned layer 66 as seen in FIG. 7. This layer of molded plastic has a thickness between about 1 and 5 mm. and is any one of several that are commercially available. The presence of ridges, such as 62, serves to protect conductive lines, such as 12, while the larger surface area of the interface between molded plastic 75 and layer 66 (due to the presence of the ridges and valleys) serves to improve adhesion to the silicon wafer (more specifically, to IMD layer 11). When viewed from above (not shown), the mean distance between ridges (i.e. the surface dimension of the valleys) is between about 1 and 5 microns while the mean surface dimension (width) of the ridges is between about 1 and 2 microns.

While the invention has been particularly shown and described with reference to the preferred embodiments thereof, it will be understood by those skilled in the art that various changes in form and details may be made without departing from the spirit and scope of the invention.

What is claimed is:

1. A process for preventing delamination of a molded plastic layer from a semiconductor surface, comprising:

depositing a dielectric layer on said semiconductor surface;

using a patterned photoresist mask, etching said dielectric layer whereby its surface becomes a pattern of alternating ridges and valleys; and forming said molded plastic layer on said patterned second dielectric layer.

2. The process of claim 1 wherein said dielectric layer is selected from the group consisting of silicon oxide and silicon oxynitride.

3. The process of claim 1 wherein the dielectric layer, prior to etching, has a thickness between about 1 and 2 microns.

4. The process of claim 1 wherein the dielectric layer, after etching, has thickness between about 0.2 and 0.5 microns in the valleys and between about 1 and 2 microns at the ridges.

5. The process of claim 1 wherein said layer of molded plastic has a thickness between about 1 and 5 mm.

6. The process of claim 1 wherein said layer of molded plastic is selected from the group consisting of silicon oxide.

7. The process of claim 1 wherein the valleys have a surface dimension between about 1 and 5 microns.

8. The process of claim 1 wherein the ridges have a surface dimension between about 1 and 2 microns.

9. A process for protecting an integrated circuit wafer, comprising:

providing a silicon wafer in whose upper surface integrated circuits have been formed;

depositing an inter-metal dielectric layer on said upper surface;

depositing a metal layer on said inter-metal dielectric layer;

patterning and etching said metal layer to form a top surface wiring pattern;

depositing a second dielectric layer on said top surface wiring pattern;

using a patterned photoresist mask, etching said second dielectric layer whereby its surface becomes a pattern of alternating ridges and valleys; and forming a layer of molded plastic on said patterned second dielectric layer, whereby said wiring pattern is protected against forces associated with the forming of the molded plastic layer and the plastic layer has good adhesion to the silicon wafer because of said ridges and valleys.

10. The process of claim 9 wherein said second dielectric layer is selected from the group consisting of oxides, nitrides, and oxynitrides.

11. The process of claim 9 wherein the second dielectric layer, prior to etching, has thickness between abou 1 and 2 microns.

12. The process of claim 9 wherein the second dielectric layer, after etching, has thickness between about 0.2 and 0.5 microns in the valleys and between about 1 and 2 microns at the ridges.

13. The process of claim 9 wherein said layer of molded plastic has a thickness between about 1 and 5 mms.

14. The process of claim 9 wherein said layer of molded plastic is selected from the group consisting of silicon oxide.

15. The process of claim 9 wherein the valleys have a surface dimension between about 1 and 5 microns.

16. The process of claim 9 wherein the ridges have a surface dimension between about 1 and 2 microns.

* * * * *